United States Patent
Iwai et al.

[11] Patent Number: 6,114,911
[45] Date of Patent: Sep. 5, 2000

[54] POWER AMPLIFIER

[75] Inventors: Hiroshi Iwai, Neyagawa; Kaoru Ishida, Shijonawate; Hiroaki Kosugi, Hirakata; Takashi Enoki; Youichi Morinaga, both of Yokohama, all of Japan

[73] Assignee: Matsushita Electric Industrial Co., Ltd., Osaka, Japan

[21] Appl. No.: 09/275,385

[22] Filed: Mar. 24, 1999

[30] Foreign Application Priority Data

Mar. 25, 1998 [JP] Japan .................................. 10-077144

[51] Int. Cl.[7] ...................................................... H03F 3/68
[52] U.S. Cl. .............................. 330/295; 330/51; 330/302
[58] Field of Search .................................. 330/51, 124 R, 330/165, 295, 302

[56] References Cited

U.S. PATENT DOCUMENTS

| | | | |
|---|---|---|---|
| 4,590,436 | 5/1986 | Butler et al. | 330/277 |
| 4,808,942 | 2/1989 | Milkovic | 330/9 |
| 5,256,987 | 10/1993 | Kibayashi et al. | 330/295 |
| 5,274,341 | 12/1993 | Sekine et al. | 330/269 |
| 5,684,430 | 11/1997 | Yamamoto | 330/124 R |
| 5,712,592 | 1/1998 | Stimson et al. | 330/124 R |

*Primary Examiner*—Benny Lee
*Assistant Examiner*—Henry Choe
*Attorney, Agent, or Firm*—Ratner & Prestia

[57] ABSTRACT

A power amplifier has an input signal splitting part for splitting the input signal into two output signals each having equal power and phase difference of 180 degrees with respect to each other. A first signal on-off selection part for switching conduction of one of the output signals. A first amplifying part for amplifying the signal from the first signal on-off selection part. A second signal on-off selection part for switching conduction of the signal outputted from the first amplifying part. A second amplifying part for amplifying the other of the output signals from the input signal splitting part. An output signal combining part for providing a phase difference of 180 degrees between the output of the second signal on-off selection part and the output of the second amplifying part and combining them. A bias on-off part for switching on and off at least the first amplifying part, wherein, when the output level is high, the first and second signal on-off selection parts are turned on and, at the same time, the first and second amplifying parts are turned on by the bias on-off part, so that push-pull operation is performed, and when the output level is low, the first and second signal on-off selection parts are turned off and the first amplifying part is turned off by the bias on-off part and the second amplifying part performs single-ended operation.

25 Claims, 5 Drawing Sheets

POWER AMPLIFIER

BACKGROUND OF THE INVENTION

1. Field of the Invention

This invention relates to a power amplifier of push-pull operation for use in a portable telephone, etc.

2. Related art of the Invention

The configuration of a push-pull power amplifier hitherto implemented on the same semiconductor chip may be shown in a block diagram of FIG. 5. Referring to FIG. 5, an input signal from an input terminal 51 is split through an input side balun circuit 52 into two signals each having equal power and phase difference of 180 degrees with respect to each other. For one of the split signals, a first input matching circuit 53 matches impedance and the signal is amplified by a first transistor 54. Then, a first output matching circuit 55 matches impedance for the signal and then the signal is inputted to one of the two inputs of an output side balun circuit 56. In the same way, a second input matching circuit 57 matches impedance for the other of the split signals and the signal is amplified by a second transistor 58. Then, a second output matching circuit 59 matches impedance for the signal, and the signal is inputted to the other input of the output side balun circuit 56.

The output side balun circuit 56 makes phase difference of 180 degrees between the input from the first output matching circuit 55 and that from the second output matching circuit 59, so that the two inputs are combined in phase and a combined signal is outputted from an output terminal 60.

However, a push-pull power amplifier with the configuration shown in FIG. 5 has such a problem that the efficiency reduces at a low output level. That is, an amplifier in general has a characteristic of high efficiency at the maximum output level, and so there is a problem that both amplifiers 54 and 58 are of low efficiency at a lower output level.

SUMMARY OF THE INVENTION

Considering these problems of the conventional power amplifiers, an object of the invention is to provide a power amplifier in which one of the amplifiers performing push-pull operation at a high output level is turned off for increasing efficiency at a low output level and which allows the reduction of loss and increase of power gain when the power amplifier is formed on the same semiconductor chip.

One aspect of the invention is a power amplifier comprising an input terminal for inputting a signal, input signal splitting means for splitting said input signal into two signals each having equal power and phase difference of 180 degrees with respect to each other and outputting said two signals, first signal on-off selection means for switching conduction/non-conduction of one of the output signals of said input signal splitting means, first amplifying means having an output matching circuit for amplifying the signal from said first signal on-off selection means, second signal on-off selection means for switching conduction/non-conduction of the signal outputted from said first amplifying means, second amplifying means having an output matching circuit for amplifying the other of the output signals from said input signal splitting means, output signal combining means for making phase difference of 180 degrees between the output of said second signal on-off selection means and the output of said second amplifying means and combining them, an output terminal for outputting the combined signal, and a bias on-off means for switching on and off at least said first amplifying means, wherein, when the output level is high, said first and second signal on-off selection means are made on and, at the same time, said first and second amplifying means are made on by said bias on-off means, so that push-pull operation is performed, and when the output level is low, said first and second signal on-off selection means is made off and said first amplifying means is made off by said bias on-off means and said second amplifying means performs single-ended operation.

Another aspect of the invention is an input signal splitting means, included in the configuration of the invention, which comprises an active balun circuit including a first FET having its source grounded, and a second FET having its gate grounded and a switch circuit capable of switching impedance. The gate of the first FET is coupled to the source of the second FET through the switch circuit. This configuration allows the on and off operation of the second FET to implement the function of the first signal on-off selection means connected to the input signal splitting means. Thereby, the circuit configuration can be made simple.

Still another aspect of the invention is an output signal combining means, included in the configuration of the invention, which comprises an active balun circuit including a first FET having its source grounded, and a second FET having its gate grounded and a switch circuit capable of switching impedance. The gate of the first FET is coupled to the source of the second FET through the switch circuit. This configuration allows the on and off operation of the second FET to implement the function of the second signal on-off selection means connected to the output signal combining means. Thereby, the circuit configuration may be made simple.

Yet another aspect of the invention is the configuration of the active balun circuit which includes a bias control circuit of the first FET and switches impedance based on the difference of impedance resulting from the impedance changed by the bias control circuit. Thereby, this configuration is allowed to substitute for the switch circuit and so the circuit configuration can be made simple.

Still yet another aspect of the invention is the configuration of the active balun circuit which switches impedance based on the difference between the impedance when the second FET is on and the impedance when the second FET is off. Thereby, this configuration is allowed to substitute for the switch circuit and so the circuit configuration can be made simple.

A further aspect of the invention is implementing each of the configurations on the same semiconductor chip. These configurations allow reduction of spacing between parts, prevention of generation of unnecessary inductance and capacitance, stable operation of the circuit and decrease of the count of constituting parts. Particularly, it is suitable for mass production of products on the same condition. A still further aspect of the components of the invention except the output signal combining means are formed on the same semiconductor chip. This configuration can avoid the loss in the output signal combining means that will be produced when all components are formed on the same semiconductor chip and so can prevent a decrease in power gain.

DESCRIPTION OF SYMBOLS

| | |
|---|---|
| 1, 51 | Input terminal |
| 2, 52 | Input side balun circuit |
| 3 | First switch circuit |
| 5, 54 | First transistor |
| 7 | Second switch circuit |
| 8, 56 | Output side balun circuit |
| 10, 58 | Second transistor |
| 12, 60 | Output terminal |
| 13 | First bias switch circuit |
| 14 | Second bias switch circuit |
| 31 | Active balun circuit |
| 32, 33 | Impedance changing switch circuit |

PREFERRED EMBODIMENTS OF THE INVENTION

Below, the present invention will be explained based on drawings illustrating the embodiments of the invention.

Embodiment 1

Figure 1:
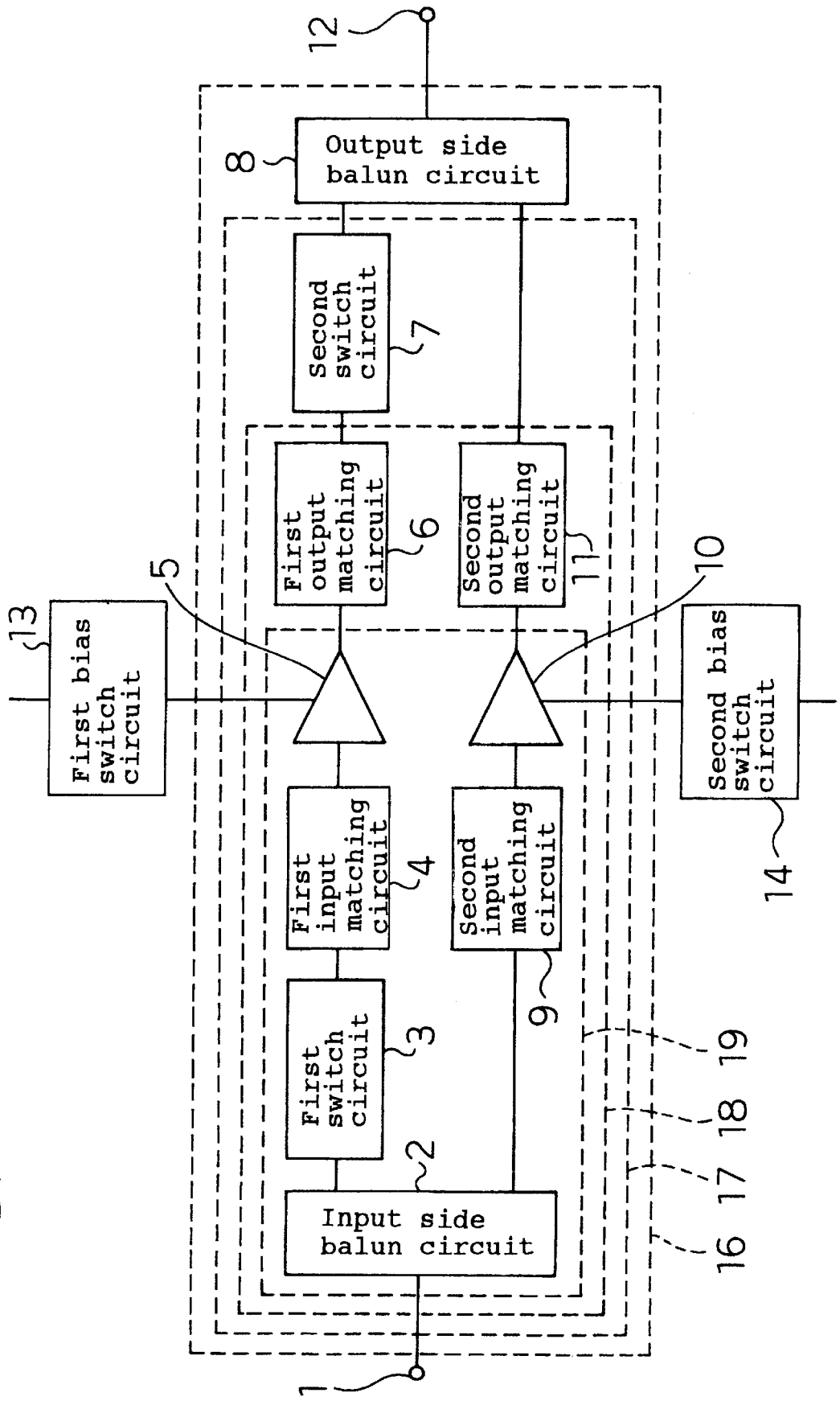
FIG. 1 is a block diagram of a power amplifier of the embodiment 1 in accordance with the present invention.

FIG. 1 is a block diagram of a power amplifier of the embodiment 1 in accordance with the present invention. Referring to FIG. 1, a power amplifier of the present embodiment comprises an input terminal 1 to input a signal, an input side balun circuit 2 operating as an input signal splitting means with two outputs for splitting the input signal to two signals which each have equal electric power and phase difference of 180 degrees with respect to each other, a first input matching circuit 4 for making up a first amplifying means, a first transistor 5, a first output matching circuit 6, a second input matching circuit 9 for making up a second amplifying means, a second transistor 10, a second output matching circuit 11, a first bias switch circuit 13 and second bias switch circuit 14 of bias on-off means capable of independently switching on and off each bias of the first and second transistors 5 and 10, a first switch circuit 3 and second switch circuit 7 of operating as first and second signals on-off selecting means for switching between conduction and non-conduction of a signal, an output side balun circuit 8 of an output signal combining means with two inputs for making phase difference of 180 degrees between the two input signals and combining them, and an output terminal 12 for outputting a signal.

The input terminal 1 is connected to the input of the input side balun circuit 2. One of the outputs of the input side balun circuit 2 is coupled to the first input matching circuit 4 through the first switch circuit 3. The output of the first input matching circuit 4 is connected to the first transistor 5. The output of the first transistor 5 is coupled to the second switch circuit 7 through the first output matching circuit 6. The output of the second switch circuit 7 is connected to one of two inputs of the output side balun circuit 8. Also, the other of the outputs of the input side balun circuit 2 is coupled to the second transistor 10 through the second input matching circuit 9. The output of the second transistor 10 is coupled to the other input of the output side balun circuit 8 through the second output matching circuit 11. The output of the output side balun circuit 8 is connected to the output terminal 12.

Next, the operation of a power amplifier of the embodiment 1 described above will be explained with reference to the drawings.

The signal dealt is assumed that a signal A of a high output level has for example an input power of 10–20 dBm and a signal B of the same frequency band as the signal A has an input power of 0–10 dBm.

First, when the signal A is amplified, an input signal with an input power level of 10–20 dBm from the input terminal 1 is split by the input side balun circuit 2 into two signals each having equal power and phase difference of 180 degrees with respect to each other, and one of the two split signals is inputted to the first switch circuit 3. As the first switch circuit 3 is in an on state (conducting state) in this case, the signal passes through the first switch circuit 3. After the impedance is matched for the signal by the first input matching circuit 4 which is capable of matching impedance for the signal A, the signal A is inputted to the first transistor 5. As the first bias switch circuit 13 is in an on state in this case, the signal is amplified by the first transistor 5. After method the impedance is matched for the signal outputted from the first transistor 5 by the first output matching circuit 6 which is capable of matching impedance for the signal A, the signal is inputted to the second switch circuit 7. As the second switch circuit 7 is in an on state (conducting state) in this case, the signal passes through the second switch circuit 7 and is inputted to one of the two inputs of the output side balun circuit 8.

Further, concerning the other of the signals split by the input side balun circuit 2, the impedance is matched for the signal by the second input matching circuit 9 which is capable of matching impedance for the signal A. Then, the signal is inputted to the second transistor 10 which has in much the same characteristics as the first transistor 5. As the second bias switch circuit 14 is in an on state in this case, the signal is amplified by the second transistor 10. For the output from the transistor 10, the impedance is matched by the second output matching circuit 11 which is capable of matching impedance for the signal A and, thereafter, the signal is inputted to the other input of the output side balun circuit 8.

These two signals that are inputted to the two inputs of the output side balun circuit 8 in this way, each having phase difference of 180 degrees with respect to each other are combined in the same phase therein and are outputted to the output terminal 12.

On the other hand, when the signal B of a lower output level is amplified, an input signal with an input power level of 0–10 dBm from the input terminal 1 is split by the input side balun circuit 2 into two signals which each have equal power and phase difference of 180 degrees with respect to each other. Although one of the two split signals is inputted to the first switch circuit 3, the first switch circuit 3 is in an off state (non-conducting state) in this case and so the signal is blocked.

Also, for the other of the split signals, the second input matching circuit 9 which is capable of matching impedance for the signal B matches impedance. Then, the signal is amplified by the second transistor 10 that has in much the same characteristics as the first transistor 5. After the impedance is matched for the output of the transistor 5 by the second output matching circuit 11 which is capable of matching impedance for the signal B, the signal is inputted to the input of the output side balun circuit 8. The signal inputted to the output side balun circuit 8 is outputted to the output terminal 12 without leakage to the first output matching circuit 6, because the second switch circuit 7 is in an off state (non-conducting state) in this case. Further, it is important in this case that the first bias switch circuit 13 is in an off state and the second bias switch circuit 14 is in an on state.

In this way, in response to the input power level, the first switch circuit 3 and second switch circuit 7 of the first and second signal on-off selection means are interlocked to switch on and off so as to switch between blocking and passing of one of the signals. Thereby, in the case of a high output level, the circuit operates to amplify the signal as a push-pull power amplifier and, in the case of a low output level, the circuit amplifies the signal as a single-ended power amplifier. Therefore, the efficiency at a low output level can be increased.

Figure 2:
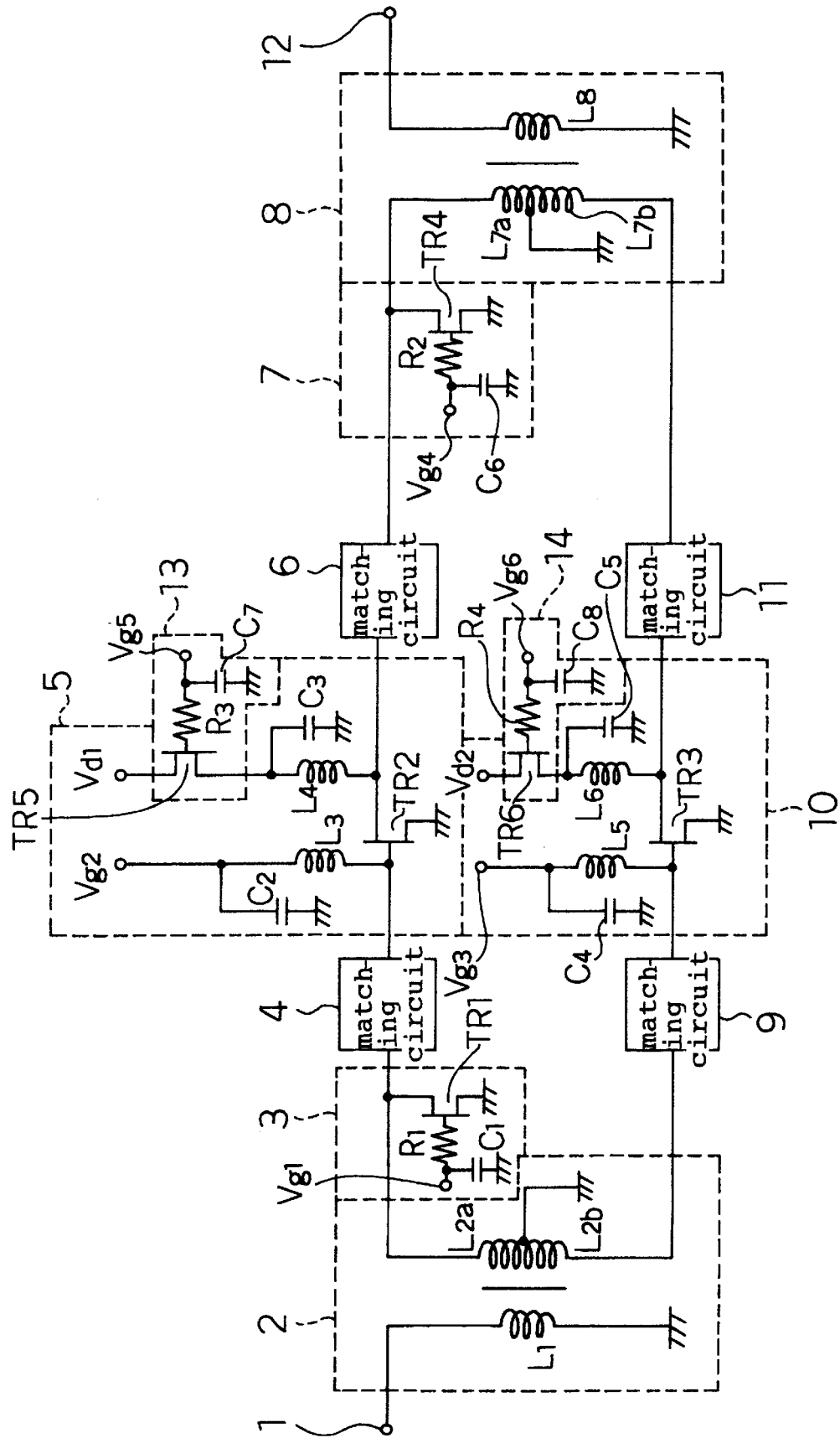
FIG. 2 is a more specific circuit diagram of the above embodiment 1.

FIG. 2 is a more specific circuit diagram of the block diagram of FIG. 1. In FIG. 2, the same reference characters are attached to the same portions as in FIG. 1, and description thereof is omitted. The matching circuit is assumed to be made up of coils and capacitors.

The input side balun circuit 2 comprises coils L1, L2a and L2b. The input terminal 1 is connected to one end of the coil L1 and the other end of the coil L1 is connected to the ground. The coils L2a and L2b are connected in series and the junction is connected to the ground, so that a transformer is formed between the coils L2a and L2b and the coil L1. Another end of the coil L2a is connected to the input of the first switch circuit 3 and another end of the coil L2b is connected to the input of the second input matching circuit 9.

The first switch circuit 3 comprises a transistor TR1, a capacitor C1 and a resistor R1. The source of the transistor TR1 is connected to the ground. The gate of the transistor TR1 is bypassed from a voltage Vg1 by a capacitor C1 and coupled to the bias voltage through the resistor R1. The drain of the transistor TR1 is connected to the junction between the output of the input side balun circuit 2 and the input of the first input matching circuit 4.

For the first transistor 5, the source of a transistor TR2 is connected to ground. The gate of the transistor TR2 is connected to the output of the first input matching circuit 4, bypassed from a voltage Vg2 by a capacitor C2 and coupled to the bias voltage through a coil L3. Further, the drain of the transistor TR2 is bypassed from a voltage Vd1 by a capacitor C3 through the first bias switch circuit 13, coupled to the bias voltage through a coil L3 and connected to the first output matching circuit 6.

The first bias switch circuit 13 comprises a transistor TR5, a capacitor C7 and a resistor R3. The source and drain of the transistor TR5 are interposed in series between the drain voltage Vd1 for the first transistor 5 and the coil L4. The gate of the transistor TR5 is bypassed from a voltage Vg5 by a capacitor C7 and coupled to the bias voltage through a resistor R3.

For the second transistor 10, a transistor TR3 has its source connected to the ground, and its gate connected to the output of the second input matching circuit 9, bypassed from a voltage Vg3 by a capacitor C4 and coupled to the bias voltage through a coil L5. The drain of the transistor TR3 is bypassed from a voltage Vd2 by a capacitor C5 through the second bias switch circuit 14, coupled to the bias voltage through a coil L6 and connected to the input of second output matching circuit 11.

The second bias switch circuit 14 comprises a transistor TR6, a capacitor C8 and a resistor R4. The source and drain of the transistor TR6 are interposed in series between the drain voltage Vd2 for the second transistor 10 and the coil L6, and the gate of the transistor TR6 is bypassed from a voltage Vg6 by a capacitor C8 and coupled to the bias voltage through the resistor R4.

The second switch circuit 7 comprises a transistor TR4, a capacitor C6 and a resistor R2. The source of the transistor TR4 is connected to the ground. The gate of the transistor TR4 is bypassed from a voltage Vg4 by a capacitor C6 and coupled to the bias voltage through the resistor R2. The drain of the transistor TR4 is connected to the junction between the input of the output side balun circuit 8 and the output of the first output matching circuit 6.

The output side balun circuit 8 comprises coils L7a, L7b and L8. One end of the coil L7a is connected to the junction between the output of the first output matching circuit 6 and the drain of the transistor TR4. One end of the coil L7b is connected to the output of the second output matching circuit 11. Another end of each of the coils L7a and L7b is connected in series to each other and its junction is grounded. The coil L8 is placed to be coupled with the coils L7a and L7b. One end of the coil L8 is connected to the output terminal 12 and the other end is connected to the ground.

Next, the operation of the power amplifier configured as described above will be explained with reference to the drawings.

First, when the signal A is amplified, the first switch circuit 3 and second switch circuit 7 are interlocked to be in a state of conduction. The first bias switch circuit 13 and the second bias switch circuit 14 independently operate to be in a state of conduction.

In this condition, an input signal from the input terminal 1 is split through the coil L1 of the input side balun circuit 2 into two signals on the L2a and L2b each having equal electric power. That is, the signal on the L2a is in the same phase with the input signal and the signal on the L2b is in the opposite phase with the input signal.

The signal inputted from the coil L2a to the first switch circuit 3 does not leak into the transistor TR1 but passes through the first switch circuit 3, because the first switch circuit 3 is controlled to make the transistor TR1 in a non-conducting state by the voltage Vg1 in this case. The first input matching circuit 4 matches impedance for the signal. Then, the signal is inputted to the first transistor 5 comprising the transistor TR2. Because the transistor TR5 is controlled to be in a conducting state by a voltage Vg5 in this case, the first bias switch circuit 13 is in an on state and so the signal is amplified by the first transistor 5. Then, after the first output matching circuit 6 matches impedance for the signal, the signal is inputted to the second switch circuit 7. Because the second switch circuit 7 is controlled to make the transistor TR4 in a non-conducting state by the voltage Vg4 in this case, the signal does not leak through the transistor TR4 and passes through the second switch circuit 7. Then, the signal is inputted to the coil L7a of the output side balun circuit 8.

On the other hand, for the signal inputted from the coil L2b to the second input matching circuit 9, the second input matching circuit 9 matches impedance for the signal. Then, the signal is inputted to the second transistor 10 comprising the transistor TR3. Because the transistor TR6 is controlled to be in a conducting state by the voltage Vg6 in this case, the second bias switch circuit 14 is in an on state and so the signal is amplified by the second transistor 10. Then, after the second output matching circuit 11 matches impedance for the signal, the signal is inputted to the coil L7b of the output side balun circuit 8.

Concerning the signals inputted to the output side balun circuit 8, the signal on the coil L7a is outputted in the same phase to the coil L8 and the signal on the coil L7b is outputted in the opposite phase to the coil L8. As the phase difference between the signals was 180 degrees when they were split at the input side balun circuit 2, the respective signals on the coil L8 are combined in the same phase to be outputted from the output terminal 12.

Next, in the case of the amplification of the signal B, the first switch circuit 3 and second switch circuit 7 are interlocked to be in a non-conducting state. The first bias switch circuit 13 is in a non-conducting state and the second bias switch circuit 14 is in a conducting state.

In this state, the input signal from the input terminal 1 is split through the coil L1 of the input side balun circuit 2 into two signals on the L2a and L2b each having equal power. The signal on the L2a is in the same phase with the input signal and the signal on the L2b is in the opposite signal with the input signal.

The signal inputted from the coil L2a to the first switch circuit 3 is coupled to the ground through the transistor TR1 and not inputted to the first input matching circuit 4, because the first switch circuit 3 is controlled to make the transistor TR1 in a conduction state by the voltage Vg1 in this case.

On the other hand, for the signal inputted from the L2b to the second input matching circuit 9, the impedance is matched by the second input matching circuit 9. Then, the signal is inputted to the second transistor 10 comprising the transistor TR3. Because the transistor TR6 is controlled to be in a conducting state by the voltage Vg6 in this case, the second bias switch circuit 14 is in an on state and so the signal is amplified by the second transistor 10. Then, after the impedance is matched for the signal by the second output matching circuit 11, the signal is inputted to the coil L7b of the output side balun circuit 8.

Because the second switch circuit 7 is controlled to make the transistor TR4 in a conducting state by the voltage Vg4 in this case, both ends of the coil L7a of the output side balun circuit 8 are connected to the ground. Thus, the signal inputted to the output side balun circuit 8 is outputted from the output terminal 12 through the coil L8 without leakage to the coil L7a. It is important that any current does not flow through the transistor TR2 making up the first transistor 5, because the transistor TR5 is controlled to be in a non-conducting state by the voltage Vg5 in this case and so the first bias switch circuit 13 is in an off state. This allows an amplifier performing push-pull operation in the case of a high output level to operate as a power amplifier performing single-ended operation in the case of a low output level, so that the efficiency at low output level can be improved.

Further, the first input matching circuit 4 and second input matching circuit 9 in the embodiment 1 described above may be omitted, if the loss of gain therein is ignored.

Embodiment 2

Figure 3:
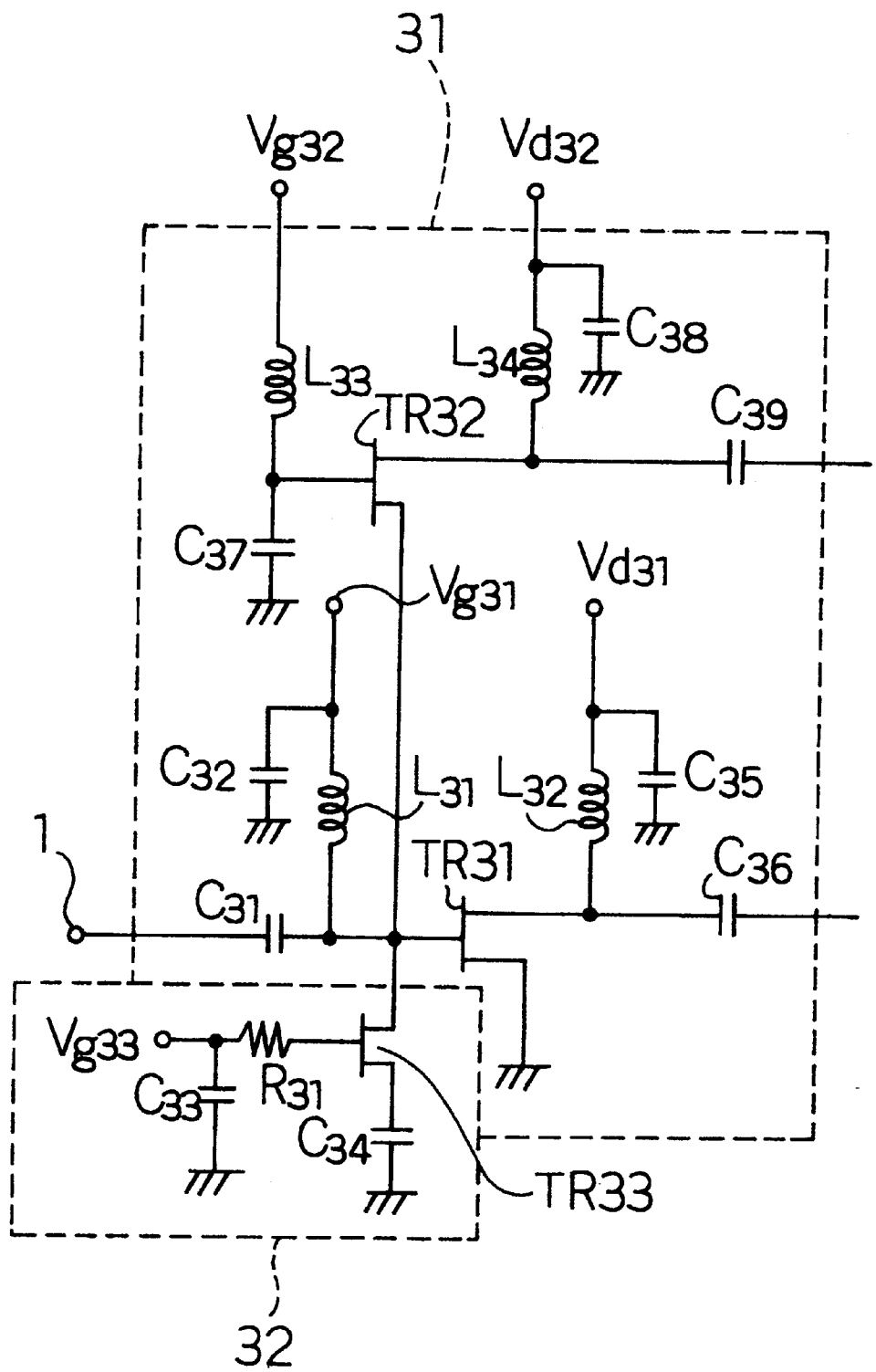
FIG. 3 is a more specific circuit diagram illustrating an example of the active balun circuit and the impedance changing switch circuit in a power amplifier of the embodiment 2 in accordance with the present invention.

FIG. 3 is a block diagram of the input side portion in a power amplifier of the embodiment 2 in accordance with the invention. That is, FIG. 3 of the embodiment 2 of the invention shows a configuration implementing the input side balun circuit 2 and the first switch circuit 3 by means of an active balun circuit 31 and an impedance changing switch 32 in FIGS. 1 and 2 of the above described embodiment 1.

Referring to FIG. 3, the active balun circuit 31 comprises transistors TR31 to TR33, coils L31 to L34, capacitors C31 to C39, resistors R31 and voltages Vg31 to Vg33, and Vd31 to Vd32. The source of the transistor TR31 is connected to the ground. The gate of the transistor TR31 is connected to the source of the transistor TR32, coupled to the bias voltage Vg31 through the coil L31, and bypassed from the voltage Vg31 by the capacitor C32. The junction between the gate and the coil L31 is coupled to the input terminal 1 through the coupling capacitor C31 and connected to the impedance changing switch 32. Also, its drain is coupled to the bias voltage Vd31 through the coil L32 and bypassed from the voltage Vd31 by the capacitor C35. A coupling capacitor C36 is connected to the drain. Further, the coupling capacitor C36 is connected, for example, to the second input matching circuit 9 shown in FIG. 1.

Concerning the transistor TR32, its source is connected to the gate of the transistor TR31. The gate of the transistor TR32 is coupled to the bias voltage Vg32 through the coil L33 and bypassed from the voltage Vg32 by the capacitor C37. Its drain is coupled to the bias voltage Vd32 through the coil L34 and bypassed from the voltage Vd32 by the capacitor C38. A coupling capacitor C39 is connected to the drain. Further, the coupling capacitor C39 is connected, for example, to the first input matching circuit 4 shown in FIG. 1.

Concerning the transistor TR33, its source is connected to the ground. Its gate is coupled to the bias voltage Vg33 through the resistor R31 and bypassed from the voltage Vg33 by the capacitor C33. Also, its drain is connected to the gate of the transistor TR31 in the active balun circuit 31. These make up the impedance changing switch 32.

Next, the operation of a power amplifier of the embodiment 2 described above will be explained with reference to the drawings.

First, in the case of the amplification of the signal A, the impedance changing switch circuit 32 is in an off state.

In this state, the input signal from the input terminal 1 is inputted to the gate of the transistor TR31 and the source of the transistor TR32 through the coupling capacitor C31 without signal leakage through the transistor TR33. It is because the impedance changing switch circuit 32 is controlled to make the transistor TR33 in a non-conducting state by the voltage Vg33 in this case. In this case, the voltage Vg31, Vg32, Vd31 and Vd32 are controlled to make both the transistors TR31 and TR32 in an on state by a control circuit (the control circuit is not shown in FIG. 3). The signal inputted to the transistor TR31 is outputted in the opposite phase through the coupling capacitor C36 because the source of the transistor TR31 is grounded. The signal inputted to the transistor TR32 is outputted in the same phase through the coupling capacitor C39 because its gate is connected to the ground. In this case, it is important to make up the matching circuit such that the transistors TR31 and TR32 may have the same gain of power.

Next, when the signal B is amplified, the impedance changing switch circuit 32 is in an on state.

In this state, an input signal from the input terminal 1 is inputted through the coupling capacitor C31 to the gate of the transistor TR31, which is controlled to be in an on state by the voltage Vg31 and Vd31. As the impedance changing switch circuit 32 is controlled to make the transistor TR33 in a conducting state by the voltage Vg33 in this case, the impedance of the transistor TR31 is changed by the capacitor C34. At this time, the transistor TR32 is controlled to be in an off state by the voltage Vd32 and so the signal does not leak to the transistor TR32. However, as the impedance is different between in an on state and in an off state of the transistor TR32, the impedance changing switch circuit 32 maintains the matching condition. This allows the same impedance to be maintained in the off state of the transistor TR32 as that in the on state of the transistor TR32. Thus, the signal inputted to the gate of the transistor TR31 is outputted in the opposite phase through the coupling capacitor C36.

It is important that the voltage Vd32 for the transistor TR32 is made on and off in interlock with the operation of the second switch circuit 7 in this case. In this way, by using an on-off switch of the transistor TR32 in the active balun circuit 31 in place of the first switch circuit 3, the circuit configuration can be made simple in addition to the action and effect of the embodiment 1.

On the other hand, in the embodiment 2 described above, there has been shown a method for implementing the input side balun circuit 2 and first switch circuit 3 by means of the active balun circuit 31 and the impedance changing switch circuit 32. By using the same method, it is naturally allowed to implement the output side balun circuit 8 and the second switch circuit 7 by means of an active balun circuit and impedance changing switch circuit.

Further, it is possible to change the impedance of the bias circuit for the transistor TR31 in the active balun circuit 31 in response to the on-off switch of the transistor TR32, in place of the impedance changing switch circuit. This method allows the circuit configuration to be made simpler.

Figure 4:
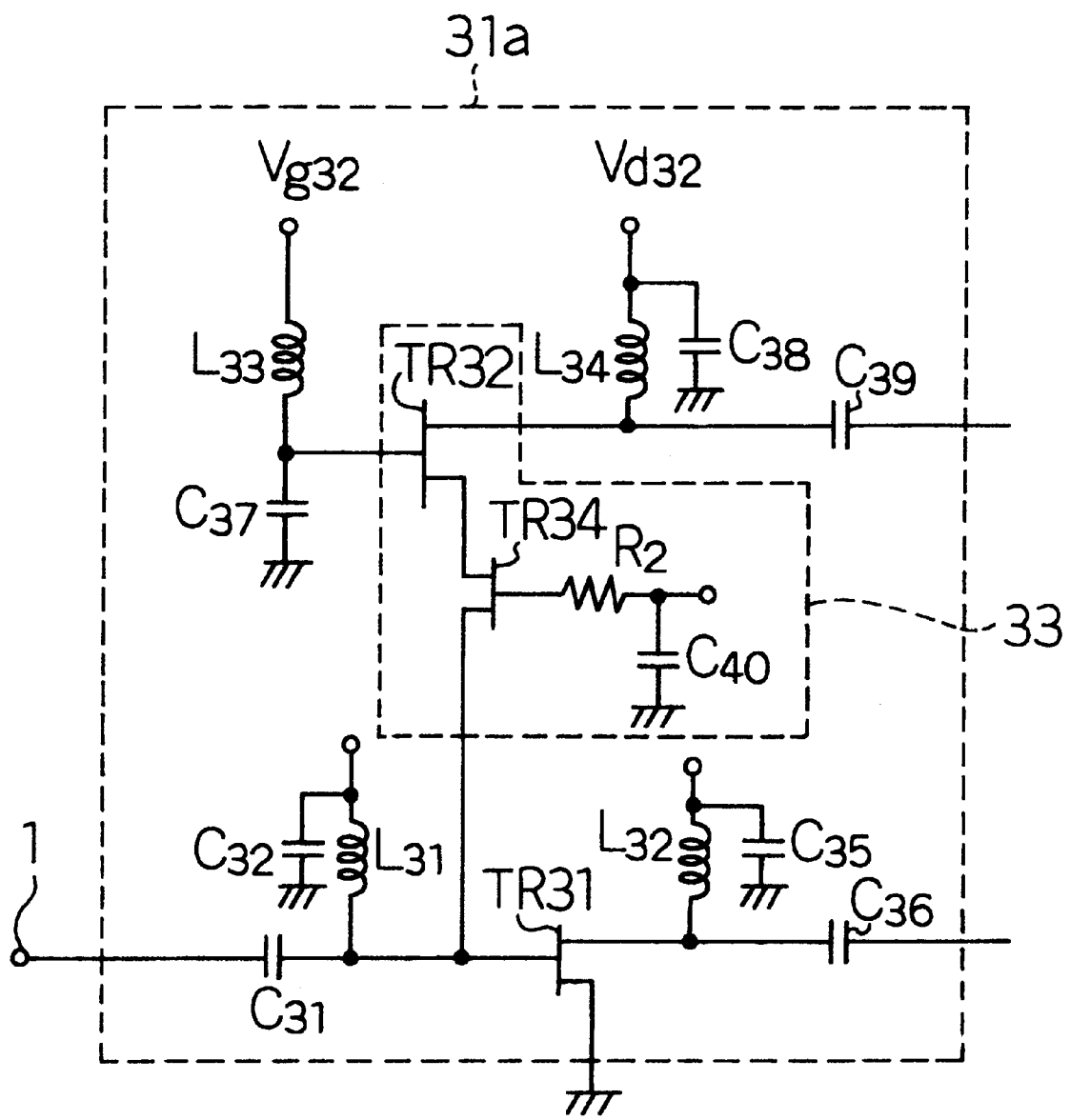
FIG. 4 is a more specific circuit diagram illustrating other example than that of FIG. 3 in the above embodiment 2.
Figure 5:
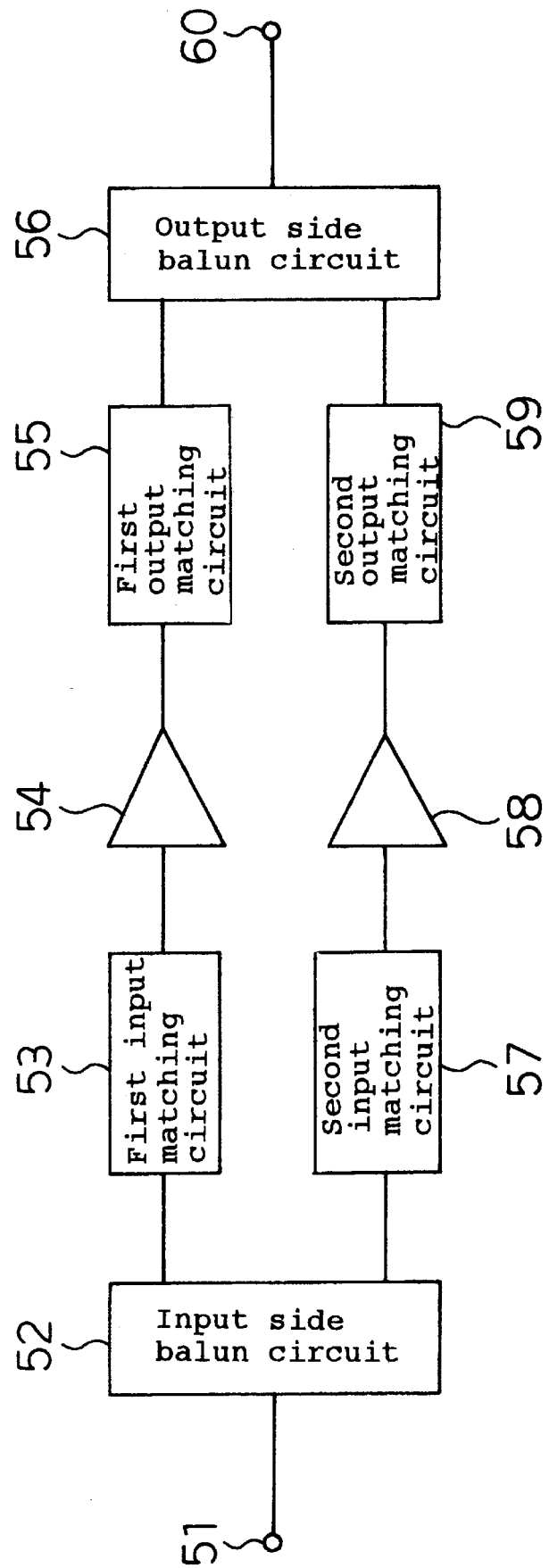
FIG. 5 is a block diagram of a conventional power amplifier.

Furthermore, as shown in an impedance changing switch circuit 33 of FIG. 4, the impedance changing switch circuit may be formed to include the transistor TR32 in the active balun circuit 31 as a component. By changing impedance depending on the difference between the impedance when the transistor TR32 is on and the impedance when the transistor TR32 is off, the circuit configuration of the impedance changing switch circuit can be made simple.

Embodiment 3

Next, as the embodiment 3 of the invention, it will be explained to integrate the circuit of the embodiment 1 described above on a chip.

All blocks shown in FIG. 1, that is, the range enclosed by dashed lines 16 is implemented on the same semiconductor chip. Such a configuration reduces spacing between the respective parts to prevent unnecessary inductance and capacitance from being generated, and stabilizes the operation of the circuit and decreases the count of parts. Particularly, it is suitable for mass production of products having the same condition.

Further, to meet various external conditions for the output terminal 12, an external component for the output side balun circuit 8 is used. By implementing on the same conductor chip the range enclosed by the dashed line 17 in FIG. 1, that is, the portion including the input side balun circuit 2, first switch circuit 3, first input matching circuit 4, first transistor 5, first output matching circuit 6, second switch circuit 7, second input matching circuit 9, the second transistor 10 and the second output matching circuit 11, the loss produced in implementing the output side balun circuit 8 on the same semiconductor chip can be avoided, and a reduction in power gain can be prevented. In addition, it is considered that the increase of versatility will find a wide range of application in many models.

Similarly, by implementing on the same semiconductor chip the range enclosed by a dashed line 18 in FIG. 1, that is, the input side balun circuit 2, first switch circuit 3, first input matching circuit 4, first transistor 5, first output matching circuit 6, second input matching circuit 9, second transistor 10 and second output matching circuit 11, the versatility increases further, and the application range is considered to spread in many models.

Also, similarly, by implementing on the same semiconductor chip the range enclosed by a dashed line 19 in FIG. 1, that is, the portion including the input side balun circuit 2, first switch circuit 3, first input matching circuit 4, first transistor 5, second input matching circuit 9 and second transistor 10, the versatility increases furthermore and the application range also is considered to spread in many models. Even in cases where the heating caused by large output power of transistors has an effect on other components, this is suitable.

By the way, here, explanations have been given on cases in which each portion enclosed by each dashed line between the input terminal 1 and output terminal 12 is made up on the same semiconductor chip. However, there is no problem in integrating on the same semiconductor chip the circuit stages before the input terminal 1 described above or the circuits following the output terminal 12 or the bias switch for each transistor, including at least the portions described above.

Also, it is needless to say that the implementation of integrated circuits of the embodiment 3 described above is applicable to the embodiment 2.

Further, the numerical values of input power illustrated in the embodiments described above are only examples and so the input power is not limited to these values.

Further, details of the circuit configurations in each of the embodiments described above can be arbitrary changed or replaced with other circuits of similar function, and the details can be changed within the scope of the claims and not limited to the circuit configurations illustrated.

Further, in all the embodiments described above, the first and second transistors were made controllable in the on-off control, but, without being limited to this, it is allowed to make only the first transistor controllable in on-off control.

As apparent from the above description, the configuration of the power amplifier according to claim 1 of the present invention allows a push-pull operation at a high output level and single-ended operation at a low output level. Thereby, the efficiency at a low output level can be improved.

Further, the configuration of claim 2 or 3 allows the implementation of the first or second signal on-off selection means by means of the on-off switch of the second FET in the active balun circuit. Thereby, the circuit configuration can be made simple.

Further, the configurations of claims 4 and 5 allow the impedance changing switch circuit configuration of claim 2 or 3 to be made simpler or omitted. Thereby, the parts count can be decreased.

Further, any of the configurations of claims 6 through 10 allows the integration of all or a portion of the components on the same semiconductor chip. Thereby, spacing between the respective parts is reduced and unnecessary inductance and capacitance are prevented from being generated and the stable operation of the circuit is achieved. Also, the parts count can be decreased. This method is suitable for the mass production of products having same condition.

Further, the configuration of claim 7 integrates the configuration of the circuits except a bias on-off means and output signal combining means on the same semiconductor chip. It can avoid the loss that the output signal combining means will cause in the integration of all components on the same semiconductor chip, and thus it can prevent power gain reduction.

What is claimed:

1. A power amplifier comprising input signal splitting means for splitting an input signal into two signals each having equal power and phase difference of 180 degrees with respect to each other and outputting said two signals, first signal on-off selection means for switching conduction of one of the output signals of said input signal splitting means, first amplifying means for amplifying the signal from said first signal on-off selection means, second signal on-off selection means for switching conduction of the signal outputted from said first amplifying means, second amplifying means for amplifying the other of the output signals from said input signal splitting means, output signal combining means for making phase difference of 180 degrees between the output of said second signal on-off selection means and the output of said second amplifying means and combining them, and a bias on-off means for switching on and off at least said first amplifying means, wherein, when an output power level is high, said first and second signal on-off selection means are turned on and, at the same time, said first and second amplifying means perform push-pull operation, and when the output power level is low, said first and second signal on-off selection means are turned off and said first amplifying means is turned off by said bias on-off means and said second amplifying means performs single-ended operation.

2. The power amplifier according to claim 1, wherein, said input signal splitting means comprises an active balun circuit including a first FET having its source grounded, a second FET having its gate grounded and a switch circuit capable of switching impedance, and the gate of said first FET is coupled to the source of said second FET through said switch circuit, and said first signal on-off selection means is implemented by the on and off of said second FET.

3. The power amplifier according to claim 1, wherein, said output signal combining means comprises an active balun circuit including a first FET having its source grounded, a second FET having its gate grounded and a switch circuit capable of switching impedance, and the gate of said first FET is coupled to the source of said second FET through said switch circuit, and said second signal on-off selection means is implemented by the on and off of said second FET.

4. The power amplifier according to claim 2, wherein, said output signal combining means comprises an active balun circuit including a first FET having its source grounded, a second FET having its gate grounded and a switch circuit capable of switching impedance, and the gate of said first FET is coupled to the source of said second FET through said switch circuit, and said second signal on-off selection means is implemented by the on and off of said second FET.

5. The power amplifier according to claim 2 further comprising:

a bias control circuit for controlling said first FET, wherein impedance is switched based on the impedance difference resulting from the impedance changed by said bias control circuit, thereby said bias control circuit substitutes for said switch circuit.

6. The power amplifier according to claim 3 further comprising:

a bias control circuit for controlling said first FET, wherein impedance is switched based on the impedance difference resulting from the impedance changed by said bias control circuit, thereby said bias control circuit substitutes for said switch circuit.

7. The power amplifier according to claim 4 further comprising:

a bias control circuit for controlling said first FET, wherein impedance is switched based on the impedance difference resulting from the impedance changed by said bias control circuit, thereby said bias control circuit substitutes for said switch circuit.

8. The power amplifier according to claim 2 wherein impedance is switched based on the difference between the impedance when said second FET is on and that when said second FET is off, which is used in place of said switch circuit.

9. The power amplifier according to claim 3 wherein impedance is switched based on the difference between the impedance when said second FET is on and that when said second FET is off, which is used in place of said switch circuit.

10. The power amplifier according to claim 4 wherein impedance is switched based on the difference between the impedance when said second FET is on and that when said second FET is off, which is used in place of said switch circuit.

11. The power amplifier according to claim 1, wherein, all components except said bias on-off means are implemented on the same semiconductor chip.

12. The power amplifier according to claim 2, wherein, all components except said bias on-off means are implemented on the same semiconductor chip.

13. The power amplifier according to claims 3, wherein, all components except said bias on-off means are implemented on the same semiconductor chip.

14. The power amplifier according to claim 1, wherein at least said input signal splitting means, said first and second amplifying means and said first and second signal on-off selection means are implemented on the same semiconductor chip.

15. The power amplifier according to claim 2, wherein at least said input signal splitting means, said first and second amplifying means and said first and second signal on-off selection means are implemented on the same semiconductor chip.

16. The power amplifier according to claim 3, wherein at least said input signal splitting means, said first and second amplifying means and said first and second signal on-off selection means are implemented on the same semiconductor chip.

17. The power amplifier according to claim 1, wherein at least said input signal splitting means, said first signal on-off selection means and said first and second amplifying means are implemented on the same semiconductor chip.

18. The power amplifier according to claim 2, wherein at least said input signal splitting means, said first signal on-off selection means and said first and second amplifying means are implemented on the same semiconductor chip.

19. The power amplifier according to claim 3, wherein at least said input signal splitting means, said first signal on-off selection means and said first and second amplifying means are implemented on the same semiconductor chip.

20. The power amplifier according to claim 1, wherein at least said input signal splitting means, said first signal on-off selection means and the components of said first and second amplifying means except said output matching circuit are implemented on the same semiconductor chip.

21. The power amplifier according to claim 2, wherein at least said input signal splitting means, said first signal on-off selection means and the components of said first and second amplifying means except said output matching circuit are implemented on the same semiconductor chip.

22. The power amplifier according to claim 3, wherein at least said input signal splitting means, said first signal on-off selection means and the components of said first and second amplifying means except said output matching circuit are implemented on the same semiconductor chip.

23. The power amplifier according to claim 1, wherein the components including said bias on-off means are implemented on the same semiconductor chip.

24. The power amplifier according to claim 2, wherein the components including said bias on-off means are implemented on the same semiconductor chip.

25. The power amplifier according to claim 3, wherein the components including said bias on-off means are implemented on the same semiconductor chip.

* * * * *